(12) United States Patent
Glent-Madsen

(10) Patent No.: US 7,145,708 B2
(45) Date of Patent: Dec. 5, 2006

(54) LIGHT MODULATING ENGINE

(75) Inventor: Henrik Glent-Madsen, Låsby (DK)

(73) Assignee: Dicon A/S (DK)

( * ) Notice: Subject to any disclaimer, the term of this patent is extended or adjusted under 35 U.S.C. 154(b) by 0 days.

(21) Appl. No.: 10/511,568

(22) PCT Filed: Apr. 9, 2003

(86) PCT No.: PCT/DK03/00237

§ 371 (c)(1),
(2), (4) Date: Oct. 12, 2004

(87) PCT Pub. No.: WO03/087915

PCT Pub. Date: Oct. 23, 2003

(65) Prior Publication Data

US 2005/0168789 A1 Aug. 4, 2005

(30) Foreign Application Priority Data

Apr. 9, 2002 (DK) ............................... 2002 00516

(51) Int. Cl.
*G02B 26/00* (2006.01)
(52) U.S. Cl. .................. 359/237; 359/259; 359/290
(58) Field of Classification Search ............... 359/237, 359/259, 290, 291, 238, 618, 346; 355/57, 355/60, 65, 66

See application file for complete search history.

(56) References Cited

U.S. PATENT DOCUMENTS

| 5,646,786 | A | 7/1997 | Kurtz et al. ................. 359/637 |
| 5,825,552 | A | 10/1998 | Kurtz et al. .................. 291/10 |
| 6,089,719 | A | 7/2000 | Lin ............................. 353/33 |
| 6,198,579 | B1 * | 3/2001 | Rupp .......................... 359/820 |
| 6,566,022 | B1 * | 5/2003 | Mizutani et al. ............... 430/5 |
| 6,963,452 | B1 * | 11/2005 | Moulin ........................ 359/618 |
| 6,976,426 | B1 * | 12/2005 | McLean et al. .......... 101/401.1 |

OTHER PUBLICATIONS

International Search Report; PCT/DK03/00237; Jun. 20, 2003.

* cited by examiner

*Primary Examiner*—Timothy Thompson
(74) *Attorney, Agent, or Firm*—Cantor Colburn LLP

(57) ABSTRACT

The invention relates to a light illumination apparatus comprising at least one exposure head (12) and at least two light modulating arrangements (20), each of said two light modulating arrangements (20) comprising a spatial light modulator (31, 32) and an associated light emitter arranged for illumination of an illumination surface (15) via said spatial light modulator (31, 32), each of said two light modulating arrangements (20) being digitally controlled, said apparatus comprising means for performing a relative movement between said at least one exposure head and said illumination surface (15) in at least one direction (x;y).

31 Claims, 4 Drawing Sheets

Figure 1:
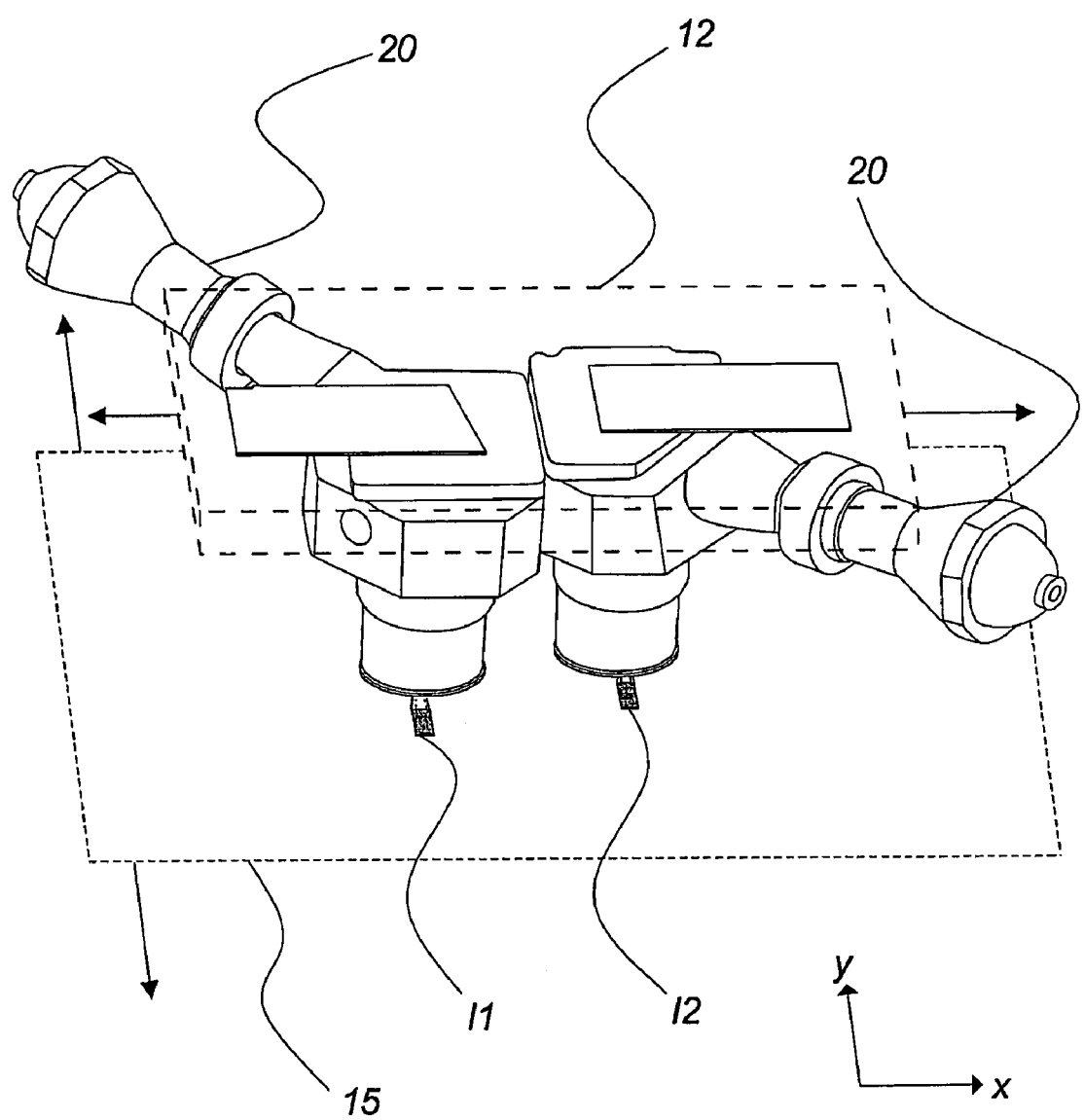

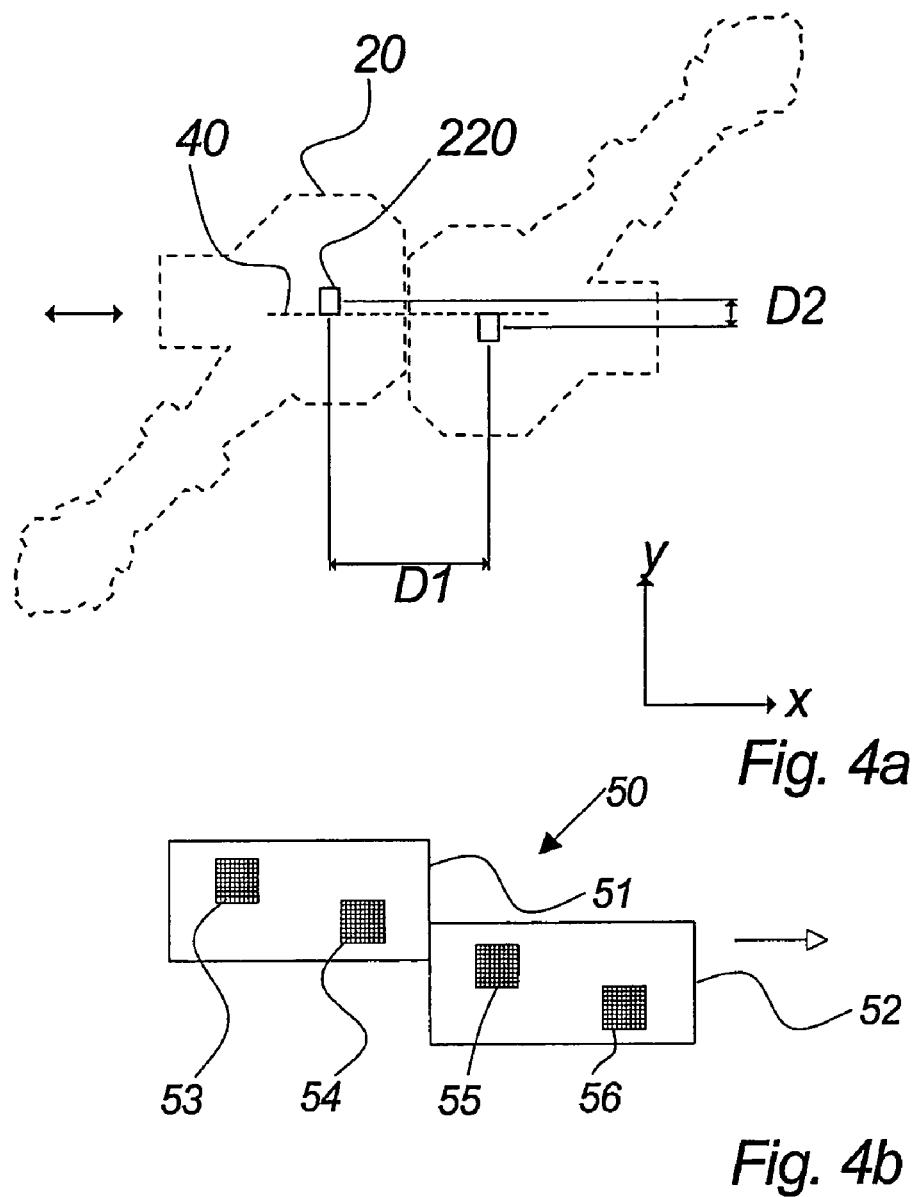
Fig. 4a
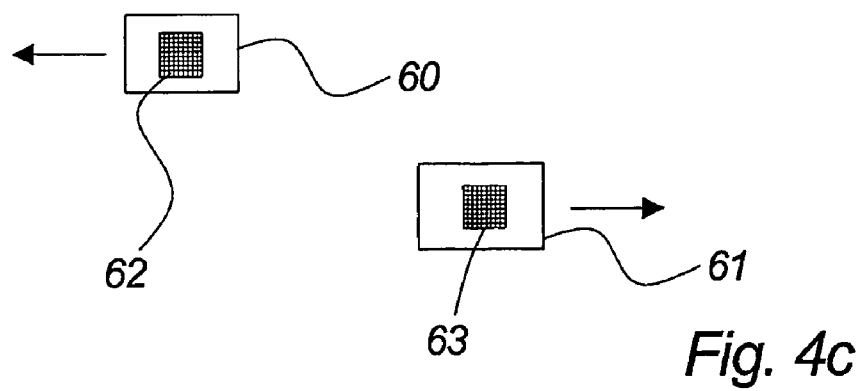
Fig. 4b
Fig. 4c

LIGHT MODULATING ENGINE

FIELD OF THE INVENTION

The present invention relates to a light illumination apparatus according to claim 1.

BACKGROUND OF THE INVENTION

A typical light illumination apparatus comprises an arrangement adapted for illuminating a light sensitive material. Such material may e.g. comprise printing plates, materials adapted for rapid prototyping, film, etc. The illuminating is performed for the purpose of obtaining certain changes of properties of the illuminated material. Such illumination may thus e.g. result in the establishment of an image on the illuminated material or a certain structure.

In order to obtain the desired illumination, light must be modulated. One prior art method of modulating light transmitting to an illumination surface is to apply a single or multiple beam laser, which may be modulated when performing a scanning movement over the illumination surface.

Another and more recent way of illuminating an illumination surface is to apply a so-called spatial light modulator. Examples of such modulators may be a DMD, an LCD, etc. The spatial light modulator is adapted for modulating an incoming light beam into a number of individually modulated light beams.

A problem of the prior art is that the obtainable modulating speed is somewhat limited due to the nature of the applied light modulators combined with the required energy and illumination speed for some applications.

SUMMARY OF THE INVENTION

The invention relates to a light illumination apparatus comprising at least one exposure head and at least two light modulating arrangements, each of said two light modulating arrangements comprising a spatial light modulator and an associated light emitter arranged for illumination of an illumination surface via said spatial light modulator,
each of said two light modulating arrangements being digitally controlled,
said apparatus comprising means for performing a relative movement between said at least one exposure head and said illumination surface in at least one direction.

According to the invention it has been realized that a movable exposure head may advantageously comprise two spatial light modulators, thereby facilitating a scanning by means of a two modulators at one time.

In an embodiment of the invention, the light illumination apparatus comprises at least one exposure head and at least two light modulating arrangements
each of said two light modulating arrangements comprising a spatial light modulator and an associated light emitter arranged for illumination of an illumination surface via said spatial light modulator,
each of said two light modulating arrangements being digitally controlled,
said apparatus comprising means for performing a relative movement between said at least one exposure head and said illumination surface in at least one direction.

In an embodiment of the invention, said at least two light modulating arrangements are arranged on the same exposure head.

In an embodiment of the invention, said relative movement is a scanning movement.

In an embodiment of the invention, said relative movement is established by moving the at least one exposure head relative to said illumination surface.

In an embodiment of the invention, said relative movement is established by moving said illumination surface relative to the at least one exposure head.

In an embodiment of the invention, at least one exposure head comprises two light modulating arrangements. It has thus been established that a cost-effective way of illuminating an illumination surface is by applying two spatial light modulation arrangements in one exposure head, thereby obtaining an illumination arrangement, which may illuminate the illumination surface in a relatively high-speed scanning movement. In this context is noted that an exposure head may be somewhat difficult to deal with when the weight of the moving arrangement increases.

In an embodiment of the invention, said relative movement is established by moving said illumination surface relative to the at least one exposure head.

In an embodiment of the invention, at least one exposure head comprises two light modulating arrangements.

In an embodiment of the invention, said light modulating arrangements are arranged on at least two different exposure heads and where said exposure heads perform scanning movements over the illumination surface. When applying two or more free-running scanning exposure heads, the illumination may be optimized carefully to the illumination surface, thereby avoiding so-called "over-scanning". In principle, any superfluous scanning may be avoided or at least minimized due to the fact that the scanning performed by the exposure heads may be adapted to avoid any conflicting movement between the applied exposure heads. Thus, a number of free-running exposure heads illuminating an illumination surface by scanning is quite advantageous with respect to efficiency due to the fact that the scanning movement as such ensures a high-speed illumination, while the free-running heads ensure that the illumination of the illumination area may be optimized as described above.

According to a further embodiment of the above-described free-running exposure heads, the number may exceed two, e.g. three or further heads in total. Moreover, each head may e.g. comprise two or further illumination arrangements, e.g. of the type described in FIG. 2.

When said spatial light modulators being arranged so as to illuminate two substantially separate sub-areas of said illumination surface, an advantageous embodiment of the invention has been obtained.

When said spatial light modulating arrangements being aligned so that the rows of both light modulators are parallelly oriented, an advantageous embodiment of the invention has been obtained.

When said spatial light modulating arrangements being aligned so that the neighboring rows of the two spatial light modulators are positioned substantially so that the distance (DN) between the two neighboring rows of the two spatial light modulators are substantially the same as the distance (DR) between the rows of the individual light modulators, an advantageous embodiment of the invention has been obtained.

When the "x-projection" (D1) of the distance between the centers of the two spatial light modulators being less than 200 millimeters, preferably less than 150 millimeters, preferably substantially 120 millimeters, an advantageous embodiment of the invention has been obtained.

When the "y-projection" (D2) of the distance between the centers of the two spatial light modulators being less than 50 millimeters, preferably less than 35 millimeters, preferably substantially 25.6 millimeters or 20.5 millimeters when applying SXGA, and XGA respectively, an advantageous embodiment of the invention has been obtained.

When the distance between the centers of the two spatial light modulators being less than 121.73 millimeters (XGA) or 122,70 millimeters (SXGA), an advantageous embodiment of the invention has been obtained.

According to the invention it has been recognized that a very close positioning of the light modulating arrangements facilitates an improved overall scanning speed in the sense that the effective scanning area is optimized. A minimizing of the distance therefore results in that both spatial light modulators of the exposure head are active as long as possible at the ends of the scanning lines.

When said exposure head comprising cooling means, an advantageous embodiment of the invention has been obtained.

Cooling means may e.g. comprise electrically driven fans.

When each spatial light modulating arrangement comprising individual cooling means, an advantageous embodiment of the invention has been obtained.

When said substantially separate sub-areas comprising neighboring surfaces of said illumination surface, an advantageous embodiment of the invention has been obtained.

When said at least one direction being substantially transverse to a relative movement of said illumination surface, an advantageous embodiment of the invention has been obtained.

When said at least one direction establishing that an illuminated pixel on said illumination surface is illuminated by means of a least two light modulators of said spatial light modulator, an advantageous embodiment of the invention has been obtained.

When said at least one direction establishing that an illuminated pixel on said illumination surface is illuminated by means of at least one modulator row of said spatial light modulator, an advantageous embodiment of the invention has been obtained.

When said exposure head being movable in at least two directions with respect to said illumination surface, an advantageous embodiment of the invention has been obtained.

When said light emitter comprising a light source, an advantageous embodiment of the invention has been obtained.

When said light emitter comprising at least on light emitting end of an optical guide coupled to a light source, an advantageous embodiment of the invention has been obtained.

When said light emitter comprising a lamp, an advantageous embodiment of the invention has been obtained.

When said light emitter comprising a LED matrix, an advantageous embodiment of the invention has been obtained.

When said spatial light modulator comprising a DMD chip, an advantageous embodiment of the invention has been obtained.

The spatial light modulating array of the illumination arrangements may be a transmissive micro-mechanical shutter array as disclosed in WO 98 47048 and WO 98 47042, which are hereby included by reference.

Another type of spatial modulator may be a DMD modulator or e.g. LCD light modulator.

When said spatial light modulator comprising a micro-mechanical transmissive light modulator, an advantageous embodiment of the invention has been obtained.

When said illumination surface comprising a printing plate, an advantageous embodiment of the invention has been obtained.

When said illumination surface comprising a light sensitive material, such as epoxy, an advantageous embodiment of the invention has been obtained. Other light sensitive materials may be applied as well within the scope of the invention such as emulsions for silkscreen printing, PCB emulsions, etc.

According to the invention, the illumination arrangement may be applied for so-called rapid prototyping.

Moreover, the invention relates to a method of illuminating an illumination surface whereby at least two light modulating arrangements arranged on at least one exposure head, each comprising a spatial light modulator illuminate the illumination surface by a scanning movement.

In an embodiment of the invention, said at least two light modulating arrangements are arranged on the same exposure head.

In an embodiment of the invention, said at least two light modulating arrangements are arranged on different free-running exposure heads.

In an embodiment of the invention, the illumination is performed by means of a light illumination apparatus according to any of the claims 1–31.

THE FIGURES

Figure 2:
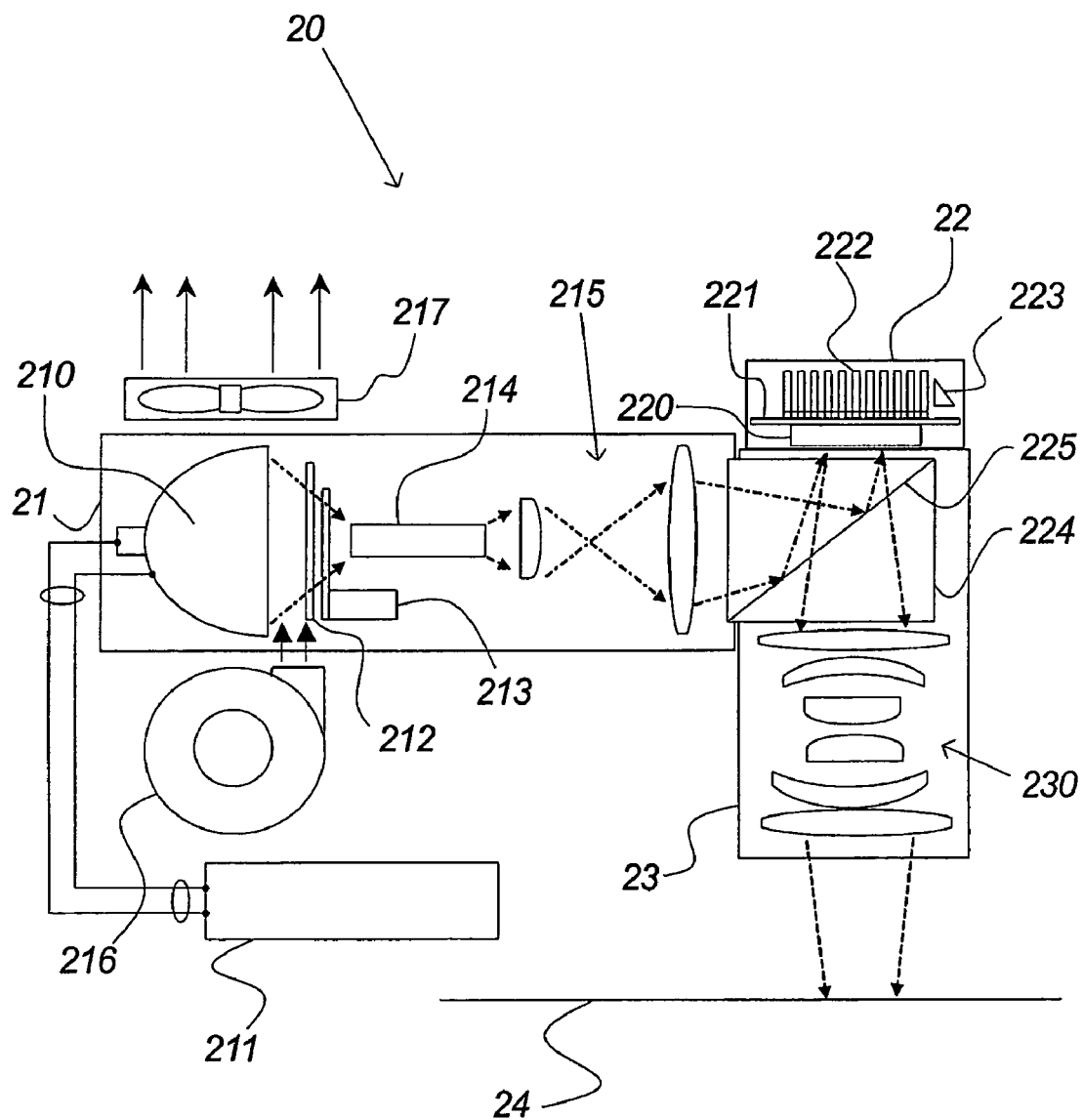
Figure 3A:
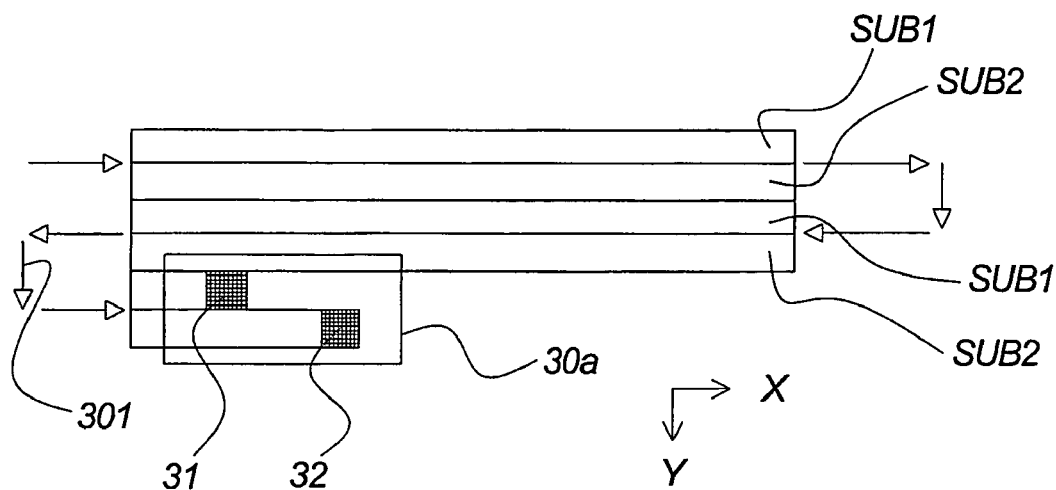
Figure 3B:
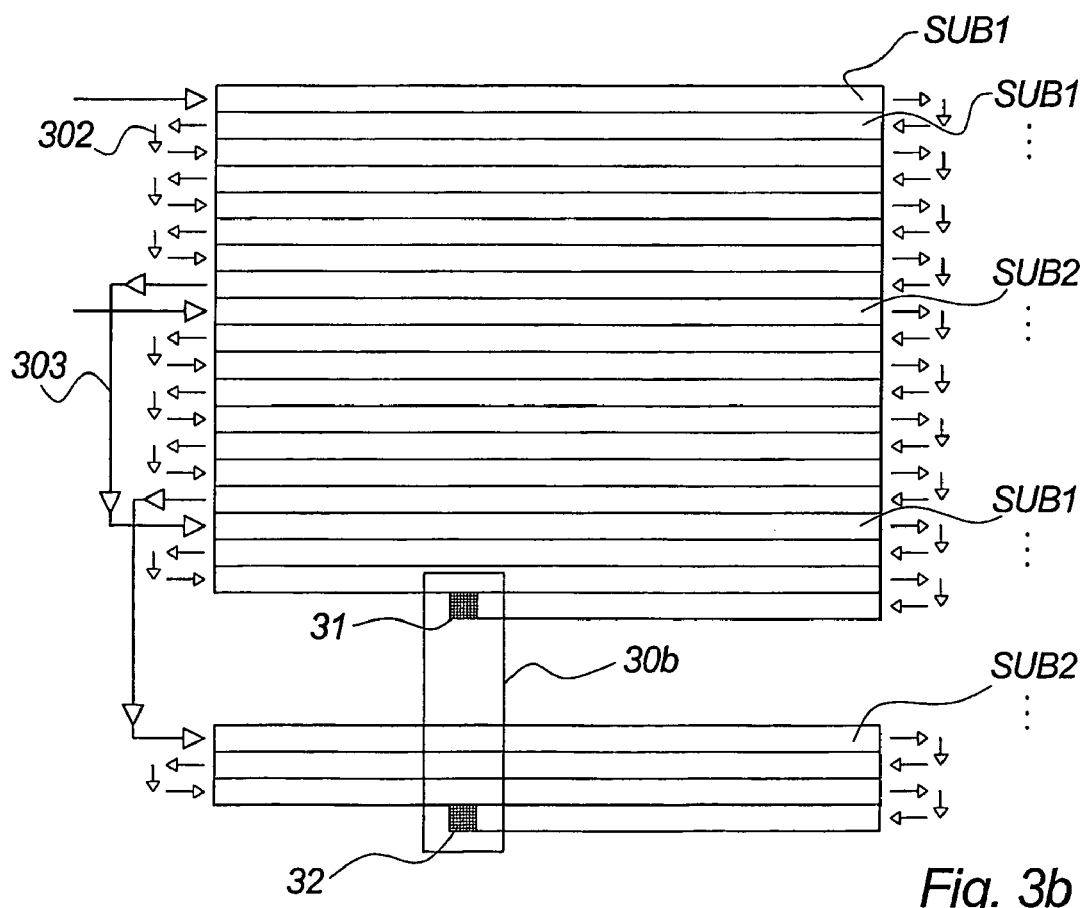

The invention will be described in the following with reference to the drawings where FIG. 1 illustrates a view of an exposure system, according to an advantageous embodiment of the invention, FIG. 2 illustrates a cross-section of an illuminating arrangement, according an embodiment of the invention, FIG. 3a illustrates a scanning pattern of an exposure head with respect to an illumination surface and where FIG. 3b illustrates a further scanning pattern of an exposure head with respect to an illumination surface FIG. 4a illustrates an advantageous positioning of the illuminating arrangements on the exposure head and where FIG. 4b–4c illustrate further embodiments of the invention.

DETAILED DESCRIPTION

FIG. 1 illustrates a view of a few main components of an exposure system, according to an advantageous embodiment of the invention.

The illustrated system comprises an exposure head 12 comprising two illumination arrangements 20 arranged for illumination of an illumination surface 15. The exposure head 12 is suspended in a suspension (not shown). The suspension facilitates movement in the direction of the arrows under control by suitable electronic circuits (not shown).

For illustrative purposes, two illumination areas I1, I2 illuminated by the spatial light modulators (e.g. DMD chips) arranged in the illumination arrangements 20 are indicated on the illumination surface. The illumination areas I1 and I2, may e.g. comprise 1024×768 (XGA) pixels or 1280×1024 pixels (SXGA) if applying e.g. TI DMD-chips. The modulated pixels will, if applying a scanning movement, be switched dynamically from row to row (or column to column) thereby applying several pixels (e.g. a complete row of a spatial light modulator) for illumination of a single pixel on the illumination surface. Thereby, the delivered optical energy to a single pixel is increased.

According to the illustrated embodiment, the exposure head is moved in the X-direction and the illumination surface 15 is moved stepwise in the Y-direction.

Evidently, other relative movements may be applied within the scope of the invention. A further advantageous embodiment of the invention may e.g. imply a relative movement of the exposure head 12 in both directions X and Y while keeping the illumination surface stationary.

The spatial light modulating array of the illumination arrangements may be a transmissive micro-mechanical shutter array as disclosed in WO 98 47048 and WO 98 47042, which are hereby included by reference.

Another type of spatial modulator may be a DMD modulator.

FIG. 2 illustrates a preferred embodiment of one of the light modulating arrangements 20 of FIG. 1. The first part 21 of the arrangement 20 produces a focused and uniform beam of light. It comprises a lamp 210, a lamp driver 211, a blower 216 and a fan 217, a protection glass 212, a shutter 213, a light-integrating rod 214 and beam shaping optics 215.

The type of lamp 210 depends on the type of plate to be exposed. Possible types comprise conventional short arc bulbs, laser sources, diode arrays and more. A preferred conventional lamp might have a power consumption of 270 W, but the present invention is not in any way limited to this value, nor to the mentioned types of lamps. Alternatives such as 250 W and 350 W may be considered.

The light from the lamp 210 is transmitted through a filter (e.g. IR or UV-filter depending on the application) 212, functioning as an interference filter, and through a shutter mechanism 213, making it possible to turn off the light beam without turning off the lamp. This is important as most lamp types need time before their light intensity and frequency is unvarying. A blower 216 and a fan 217 ensure the cooling of the lamp 210.

Subsequently the light beam is transmitted through a light-integrating rod 214. Thereby the light is mixed, making the light throughout the beam uniform with regards to intensity. This ensures that the light in the periphery of the beam has the same intensity as the light in the center of the beam. When the light leaves the light-integrating rod 214, the beam shaping optics 215 focuses it.

The next part of the arrangement 20 modulates the light beam to reflect electronically stored image data. It comprises a light-modulating means 22 and means 224 for directing the unmodulated light beam towards the light-modulating means 22 without disturbing its modulated light beam output.

Suited light-modulating means 22 comprises DMD modulators, transmissive shutters including LCD and micro-mechanical shutters and more. For the preferred embodiment of FIG. 2, a DMD light-modulating chip 220 mounted on a PCB 221 with a cooling plate 222 and a temperature sensor 223 is used.

The light directing means 224 depends on the type of light-modulating means 22 used. For transmissive light modulating means the unmodulated light beam is directed towards one side of the light modulating means, and the modulated light beam is emitted from the other side. In such an arrangement the light directing means 224 might be excluded.

For DMD modulators the unmodulated light beam is directed towards the same point as where the modulated light beam is emitted. This necessitates the use of light directing means 224. In the preferred embodiment of FIG. 2, a TIR-prism is used for light directing means. TIR is an abbreviation meaning 'Total Internal Reflection'. A TIR-prism comprises a surface 225 which will act as a mirror to light coming from one direction (from the left for this specific embodiment), and will let light coming from another direction (from the top for this specific embodiment) straight through.

The last part of the arrangement 20 focuses the multiple modulated light beams emitted from the light modulating means 220 on an illumination surface 24 (printing plate). It comprises a set of lenses/a macro lens 230 located within a housing 23. FIG. 3a illustrates a scanning pattern of an exposure head with respect to an illumination.

The illustrated scanning pattern obtained by the light illumination apparatus according to the invention, e.g. the illumination arrangement as described in FIG. 2, involves that two illuminating arrangements 31, 32 of an exposure head 30a perform a relative movement with respect to an illumination surface. Both illumination arrangements 31, 32 are arranged on the same exposure head 30a.

One of the illustrated illumination arrangements 31 illuminates the sub areas SUB1 and the other illumination arrangement 32 illuminates the sub areas SUB2.

It should be noted that the exposure head 30a illuminates the illumination surface by modulated light in both directions in a scanning movement as indicated by the horizontal arrows while shifting between each scanning movement in steps 301, as indicated by the vertical arrow.

The y-axis movement is here performed as steps corresponding to the total transverse scanning width obtained by both light illuminating arrangements in combination.

FIG. 3b illustrates a further scanning pattern of an exposure head 30b with respect to an illumination surface.

According to the illustrated embodiment of the invention, an exposure head 30b comprises two spatial light modulators 31, 32 (the illumination arrangements carrying the spatial modulators are not illustrated). The applied illumination arrangements 31, 32 may e.g. both be the illustrated illumination arrangement of FIG. 2. According to the illustrated embodiment, two spatial light modulators 31, 32 (or the resulting illuminated surface corresponding to I1, and I2 of FIG. 1) are arranged and displaced only in the Y-direction.

The exposure head 30b is performing a scanning movement back and forth in the X-direction. Moreover, the illumination surface or the exposure head performs a relative movement in the Y-direction involving basically two different steps, a micro step 302 and a macro step 303.

According to the illustrated embodiment, eight sub-areas SUB1 and eight sub-areas SUB2 are illuminated by performing the micro-steps 302. Thereafter, a macro step 303 is performed and a new set of sub-areas, SUB1 and SUB2, is illuminated by performing further micro steps 302.

It should be emphasized that several other scanning methods (patterns) may be applied within the scope of the invention.

FIG. 4a illustrates an advantageous positioning of the illuminating arrangements (here=optical engines) on the exposure head of e.g. FIG. 3a. The illumination arrangement 20, which e.g. may be the one illustrated in FIG. 2, is indicated by dashed lines.

The dimensions of the optical engine are very important for the productivity and cost of the machine. The two illuminating arrangements 20 of the exposure head are located so that the obtainable illuminated areas are adjacent in the direction of the y-axis (not to be confused with the scanning and modulator axis). This implies that there is a center distance between the optical engines in the x-axis, see FIG. 4a.

The mutual distance between the engines in the x-axis implies that it is necessary to expose longer than the actual plate length so that both heads have passed the entire plate (the illumination surface). This superfluous "over-scan" is twice the center distance D1. This over-scan reduces the productivity and increases the width of the x-movement and thus the width of the machine. The center distance must therefore be as low as possible. An example of such minimized distance may e.g. be Center distance, x-axis: D1=120 mm Center distance, y-axis: D2=(XGA) 20.48±0.002 mm and D2 (SXGA)=25.6±0.002 mm The lower limit is defined by the optics and the further illumination arrangement component, e.g. the macro lens 230 of FIG. 2. A fixture (not shown) will allow adjustment in the illumination plane, i.e. adjustment in x- and y-axis, and rotation about the z-axis, of the optical engines individually. This implies that the image must be accurately parallel to the flange of the macro lens house, so that both images will be in the same plane. The flange on the house is used to mount the house to the fixture, in the z-direction. The bottom side of the flange will define the focus, so that the optical engines can be mounted against a flat surface, and thus having focus in the same plane.

FIG. 4b illustrates a further embodiment of the invention, where the apparatus comprises four light modulating arrangements 53, 54, 55, 56, e.g. of the type illustrated in FIG. 2, arranged on an exposure head 50.

The four light modulating arrangements 53, 54, 55 and 56 all move together due to the fixation to the same exposure head. A scanning may advantageously be performed in several different ways, e.g. according to the principles illustrated in FIG. 3a.

FIG. 4c illustrates a further embodiment of the invention, where the apparatus comprises two light modulating arrangements 62, 63, e.g. of the type illustrated in FIG. 2.

The illustrated embodiment comprises two separate exposure heads 60, 61, each carrying a modulating arrangement 62, 63.

The illustrated embodiment of the invention has the advantage that the illumination, when applying a scanning e.g. in the direction of the illustrated arrows, may be optimized carefully to the illumination surface, thereby avoiding the above-described "over-scanning". In principle, any superfluous scanning may be avoided due to the fact that the scanning performed by the exposure heads 60, 61 may be adapted to avoid any conflicting movement between the applied exposure heads 60, 61.

The illustrated embodiment, featuring a number of free-running exposure heads illuminating an illumination surface by scanning, is quite advantageous with respect to efficiency due to the fact that the scanning movement as such ensures a high-speed illumination, while the free-running heads ensure that the illumination of the illumination area may be optimized as described above.

Evidently, the embodiment of FIG. 4c may be modified to incorporate fisher illumination heads, e.g. three or further heads in total.

The invention claimed is:

1. Light illumination apparatus comprising:
   at least one exposure head;
   at least two light modulating arrangements,
   each of said two light modulating arrangements comprising a spatial light modulator and an associated light emitter arranged for illumination of an illumination surface via said spatial light modulator;
   each of said two light modulating arrangements being digitally controlled;
   said apparatus further comprising means for performing a relative movement between said at least one exposure head and said illumination surface in at least one direction;
   wherein the exposure head is adapted for scanning in two transverse opposite directions.

2. Light illumination apparatus according to claim 1, wherein said at least two light modulating arrangements are arranged on a single exposure head.

3. Light illumination apparatus according to claim 1, wherein said relative movement is a scanning movement.

4. Light illumination apparatus according to claim 1, wherein said relative movement is established by moving the at least one exposure head relative to said illumination surface.

5. Light illumination apparatus according to claim 1, wherein said relative movement is established by moving said illumination surface relative to the at least one exposure head.

6. Light illumination apparatus according to claim 1, wherein the at least one exposure head comprises the two light modulating arrangements.

7. Light illumination apparatus according to claim 1, wherein said light modulating arrangements are arranged on at least two different exposure heads and where said exposure heads perform scanning movements over the illumination surface.

8. Light illumination apparatus according to claim 1, wherein said spatial light modulators are arranged so as to illuminate at least two substantially separate sub-areas of said illumination surface.

9. Light illumination apparatus according to claim 1, wherein said spatial light modulating arrangements are aligned so that rows of both light modulators are parallelly oriented.

10. Light illumination apparatus according to claim 1, wherein said spatial light modulating arrangements are aligned so that neighboring rows of the at least two spatial light modulators are positioned substantially so that a distance between the neighboring rows of the at least two spatial light modulators is substantially the same as a distance between rows of the individual light modulators.

11. Light illumination apparatus according to claim 1, wherein an "x-projection" of a distance between centers of at least two of the spatial light modulators is less than approximately 200 millimeters.

12. Light illumination apparatus according to claim 1, wherein a "y-projection" of a distance between centers of two of the spatial light modulators is less than approximately 50 millimeters.

13. Light illumination apparatus according to claim 1, wherein a distance between centers of two of the spatial light modulators is substantially 122.7 millimeters or 121.73 millimeters when applying SXGA and XGA, respectively.

14. Light illumination apparatus according to claim 1, wherein said exposure head comprises cooling means.

15. Light illumination apparatus according to claim 1, wherein each spatial light modulating arrangement comprises individual cooling means.

16. Light illumination apparatus according to claim 8, wherein said substantially separate sub-areas comprise neighboring surfaces of said illumination surface.

17. Light illumination apparatus according to claim 1, wherein said at least one direction is substantially transverse to a relative movement of said illumination surface.

18. Light illumination apparatus according to claim 1, wherein said at least one direction establishes that an illuminated pixel on said illumination surface is illuminated by means of a least two light modulators of said spatial light modulator.

19. Light illumination apparatus according to claim 1, wherein said at least one direction establishes that an illuminated pixel on said illumination surface is illuminated by means of at least one modulator row of said spatial light modulator.

20. Light illumination apparatus according to claim 1, wherein said exposure head is movable in at least two directions with respect to said illumination surface.

21. Light illumination apparatus according to claim 1, wherein said light emitter comprises a light source.

22. Light illumination apparatus according claim 1, wherein said light emitter comprises at least one light emitting end of an optical guide coupled to a light source.

23. Light illumination apparatus according to claim 1, wherein said light emitter comprises a lamp.

24. Light illumination apparatus according to claim 1, wherein said light emitter comprises an a LED matrix.

25. Light illumination apparatus according to claim 1, wherein said spatial light modulator comprises a DMD chip.

26. Light illumination apparatus according to claim 1, wherein said spatial light modulator comprises a micromechanical transmissive light modulator.

27. Light illumination apparatus according to claim 1, wherein said illumination surface comprises a printing plate.

28. Light illumination apparatus according to claim 1, wherein said illumination surface comprises a light sensitive material.

29. Light illumination apparatus according to claim 1, wherein an x-direction between centers of the spatial light modulating arrangement is less than 150 mm.

30. Light illumination apparatus according to claim 29, wherein the x-direction between centers of the spatial light modulating arrangement is substantially.

31. Method of illuminating an illumination surface, whereby the illumination is performed by a light illumination apparatus according to claim 1.

* * * * *